(12) United States Patent
Smith

(10) Patent No.: US 10,820,444 B2
(45) Date of Patent: Oct. 27, 2020

(54) SYSTEMS AND METHODS FOR MONITORING THE PRESENCE OF RACK MOUNTED EQUIPMENT

(71) Applicant: CommScope Technologies LLC, Hickory, NC (US)

(72) Inventor: Peter Smith, Chester (GB)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/324,334

(22) PCT Filed: Aug. 28, 2017

(86) PCT No.: PCT/US2017/048875
§ 371 (c)(1),
(2) Date: Feb. 8, 2019

(87) PCT Pub. No.: WO2018/044780
PCT Pub. Date: Mar. 8, 2018

(65) Prior Publication Data
US 2019/0174650 A1 Jun. 6, 2019

Related U.S. Application Data

(60) Provisional application No. 62/382,021, filed on Aug. 31, 2016.

(51) Int. Cl.
*H05K 7/14* (2006.01)
*G06F 15/16* (2006.01)
*G06F 11/30* (2006.01)

(52) U.S. Cl.
CPC ........... *H05K 7/1494* (2013.01); *G06F 11/30* (2013.01); *G06F 15/16* (2013.01); *H05K 7/1487* (2013.01); *H05K 7/1498* (2013.01)

(58) Field of Classification Search
None
See application file for complete search history.

(56) References Cited

U.S. PATENT DOCUMENTS 5,949,207 A * 9/1999 Luebke .................. E05F 15/41
318/446
7,381,909 B2 * 6/2008 Gudbjartsson ..... G01G 19/4144
177/238

(Continued)

FOREIGN PATENT DOCUMENTS

EP 2492240 A1 8/2012

OTHER PUBLICATIONS

International Searching Authority; Notification of Transmittal of the International Search Report and the Written Opinion of the International Searching Authority, from PCT Application No. PCT/US2017/048875 dated Dec. 8, 2017; from Foreign Counterpart of U.S. Appl. No. 62/382,021; pp. 1-13; dated Dec. 8, 2017; Published: KR.

(Continued)

*Primary Examiner* — Chico A Foxx
(74) *Attorney, Agent, or Firm* — Fogg & Powers LLC

(57) ABSTRACT

Systems and methods for monitoring the presence of rack mounted equipment are described herein. In certain embodiments, a system includes one or more racks, each rack in the one or more racks configured to hold rack mounted equipment at one or more positions within the rack. The system also includes one or more sensor bars associated with each position in the one or more positions, wherein each sensor bar in the one or more sensor bars produces a signal that indicates whether the rack mounted equipment is located at the position associated with a respective sensor bar. Further, the system includes an analyzer configured to receive the signal produced by the sensor bar, wherein the analyzer (Continued)

provides an indication that rack mounted equipment is located at the position to an infrastructure management system.

26 Claims, 4 Drawing Sheets

(56) References Cited

U.S. PATENT DOCUMENTS

| | | | | |
|---|---|---|---|---|
| 7,752,088 B1* | 7/2010 | Coschera | ............ | G06Q 10/087 |
| | | | | 705/28 |
| 8,094,020 B2* | 1/2012 | Groth | ............... | G06Q 10/087 |
| | | | | 340/568.2 |
| 8,831,772 B2* | 9/2014 | Bridges | ................ | G11B 15/68 |
| | | | | 700/213 |
| 9,510,679 B2* | 12/2016 | Bhatt | ...................... | A47B 88/00 |
| 10,249,170 B1* | 4/2019 | Huang | ................ | G08B 21/182 |
| 10,386,224 B2* | 8/2019 | Shim | ...................... | B25J 19/028 |
| 10,426,007 B2* | 9/2019 | Kawamura | ............ | H05B 47/00 |
| 10,499,534 B2* | 12/2019 | Masuyama | .......... | H05K 7/1498 |
| 10,534,122 B2* | 1/2020 | Goss | ................... | G02B 6/0008 |
| 2005/0077352 A1* | 4/2005 | Gudbjartsson | ....... | G06Q 10/087 |
| | | | | 235/385 |
| 2005/0085704 A1* | 4/2005 | Schulz | ............... | A61B 5/14552 |
| | | | | 600/344 |
| 2006/0162364 A1 | 7/2006 | Felcman et al. | | |
| 2007/0187343 A1* | 8/2007 | Colucci | ................... | G06F 1/183 |
| | | | | 211/26 |
| 2007/0222597 A1 | 9/2007 | Tourrilhes et al. | | |
| 2008/0265722 A1 | 10/2008 | Saliaris | | |
| 2012/0133510 A1 | 5/2012 | Pierce et al. | | |
| 2012/0182151 A1* | 7/2012 | Tong | ................... | H05K 7/1498 |
| | | | | 340/666 |
| 2012/0245969 A1 | 9/2012 | Campbell | | |
| 2014/0292167 A1* | 10/2014 | Sojka | ...................... | H05K 7/20 |
| | | | | 312/234 |
| 2015/0188245 A1 | 7/2015 | Coffey et al. | | |
| 2017/0052270 A1* | 2/2017 | Schatz | ...................... | G01L 1/04 |

OTHER PUBLICATIONS

European Patent Office, "Extended European Search Report from EP Application No. 17847300.5", from Foreign Counterpart to U.S. Appl. No. 16/324,334, filed Mar. 19, 2020, pp. 1-11, Published: EP.

* cited by examiner

SYSTEMS AND METHODS FOR MONITORING THE PRESENCE OF RACK MOUNTED EQUIPMENT

CROSS-REFERENCE TO RELATED APPLICATIONS

This application is a U.S. National Stage 371 Application of International Patent Application No. PCT/US2017/048875 titled "SYSTEMS AND METHODS FOR MONITORING THE PRESENCE OF RACK MOUNTED EQUIPMENT" filed on Aug. 28, 2017, which claims priority to, and the benefit of U.S. Provisional Patent Application Ser. No. 62/382,021, filed on Aug. 31, 2016, which are hereby incorporated herein by reference.

BACKGROUND

Telecommunications networks typically include numerous logical communication links between various items of equipment. Often a single logical communication link is implemented using several pieces of physical communication media. For example, a logical communication link between a computer and an inter-networking device such as a hub or router can be implemented as follows. A first cable connects the computer to a jack mounted in a wall. A second cable connects the wall-mounted jack to a port of a patch panel, and a third cable connects the inter-networking device to another port of a patch panel. A "patch cord or cable" cross connects the two together. In other words, a single logical communication link is often implemented using several segments of physical communication media.

Various types of physical layer management (PLM) systems can be used to track connections made at patch panels and other types of equipment used to make connections in communication networks. Generally, such PLM systems include functionality to track what is connected to each port of such equipment, trace connections that are made using such equipment, and provide visual indications to technicians at such equipment (for example, by illuminating an LED that is associated with a patch panel or a port thereof).

PLM systems typically include management software that aggregates the captured information and stores it in one or more databases. One example of such management software is Infrastructure Configuration Manager (ICM) software.

In addition to information about the connections and cabling used to make them, these databases also typically store information about the other equipment used to make the connections. Examples of such equipment include patch panels, distribution panels, and active networking devices such as switches, routers, and gateways. Examples of information that is stored in the database about such equipment include information about the make and model of the equipment and where it is installed in the network.

Typically, information about where such equipment is installed in the network must be manually entered. This is commonly the case even for "intelligent" equipment that can be automatically discovered by the PLM management software and queried for its identification information (for example, serial number and make and model).

In certain implementations, an ICM is able to model a data network and monitor connectivity as described above. However, the ICM may be unable to directly report and directly monitor the physical presence of equipment. An ICM may be able to infer the presence of equipment through the monitoring of connectivity. For example, if a piece of rack mounted equipment is removed, the ICM is only able to infer that the rack mounted equipment is missing through the disappearance of connections and/or development of unresponsive equipment. However, there is no direct monitoring of the presence or lack thereof of the rack mounted equipment.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the exemplary embodiments described herein, systems and methods for directly monitoring for the presence of rack mounted equipment are provided. To monitor a system for the presence of rack-mounted equipment, an infrastructure management system may connect to an analyzer that monitors signals produced by a sensor bar through which rack mounted equipment connects to a rack. In certain exemplary implementations, the sensor bar may include a switch mechanism that responds to the pressure of the rack mounted equipment as it is attached to the rack. In certain implementations, an elastomeric material may provide cushioning as the mounted equipment is attached to the rack.

Figure 1:
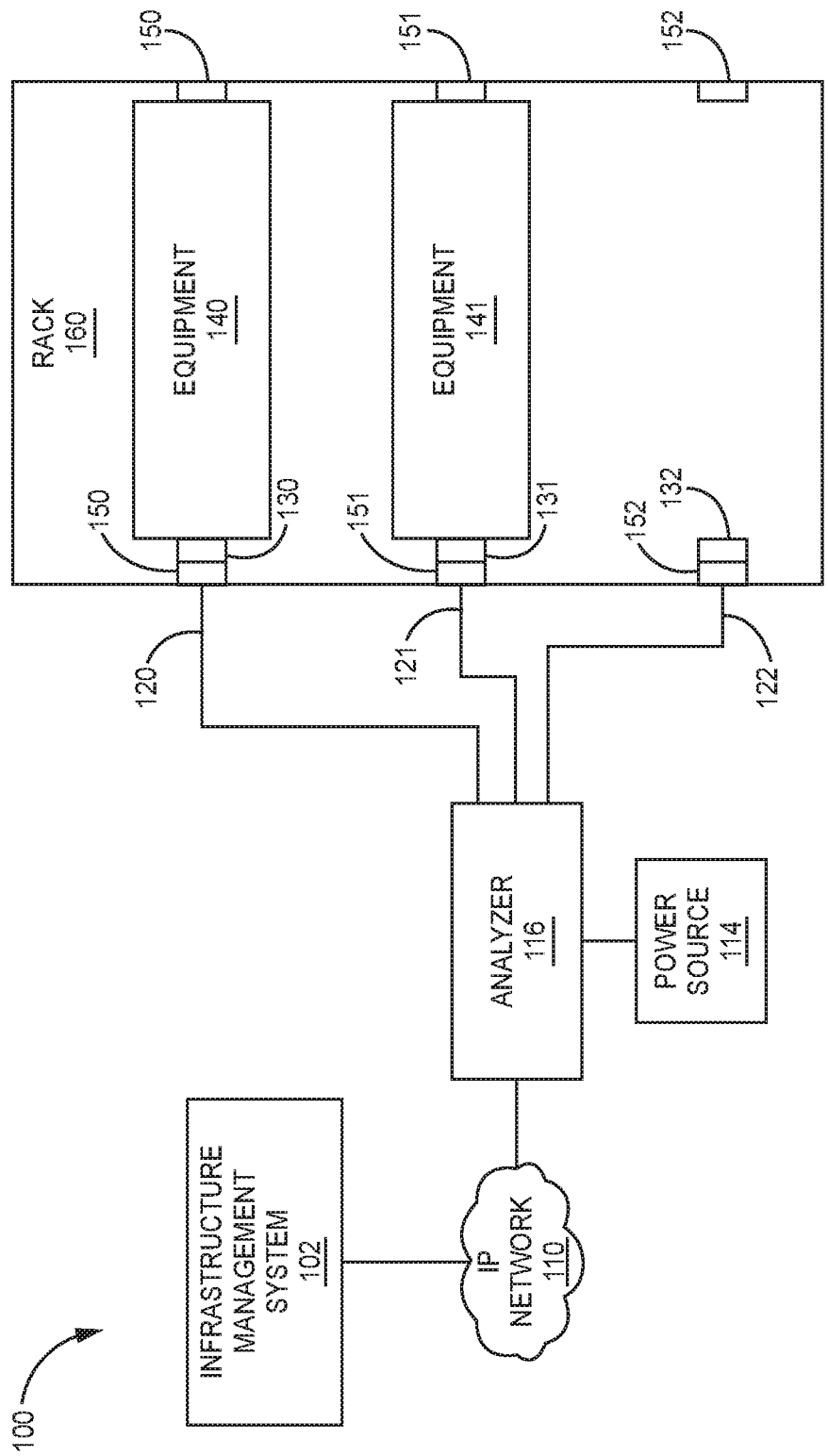
FIG. 1 is a block diagram of an exemplary embodiment of a communication system capable of directly monitoring for the presence rack mounted equipment.

FIG. 1 shows one exemplary embodiment of a system 100 that is able to detect the presence of equipment 140-141 mounted in a rack 160 using sensor bars 130-132. Rack 160 may be one of multiple racks or a standalone rack that is configured to hold various pieces of equipment 140-141 where it can be accessible to a user. For example, the equipment 140-141 may include patch panels, monitoring equipment, and the like. To mount the equipment 140-141 within the rack 160, the equipment 140-141 is connected to mounting bars 150-152. Mounting bars 150-152 may be structurally reinforced sections of the outer wall of a rack, where the reinforced sections have holes therein where screws or bolts may connect the equipment to the reinforced sections. In one exemplary implementation, bolts may pass through holes in the sides of the equipment 140-141 and into holes in the mounting bars 150-151, where threads on the bolts thread into the holes in the mounting bars 150-151. Alternatively, other attachment types may be used that hold the equipment 140-141 securely within the rack 160 against the mounting bars 150-151.

In certain exemplary embodiments described herein, sensor bars 130-132 may be placed between the mounting bars 150-151 and the equipment 140-141. As illustrated, the sensor bars 130-132 may be placed on only one side of the rack 160. Alternatively, the sensor bars 130-132 may be located on both sides of the rack 160. As the equipment 140-141 is placed in the rack and tightened against the mounting bars 150-151, pressure is applied to the sensor bars 130-131. As pressure is applied to the sensor bars 130-132, the sensor bars 130-132 produce a signal that indicates that equipment is presently attached within the rack 160. In certain implementations, the sensor bars 130-132 communicate the signal to an analyzer 116 via communication lines 120, 121, and 122. Based on the received signal, the analyzer 116, may determine whether rack equipment 140-141 is present in the rack. In further implementations, the communication lines 120, 121, and 122 are associated with a location within the rack 160. Accordingly, the analyzer 116 may also be able to determine where rack equipment 140-141 is located within the rack 160. Alternatively, each sensor bar may communicate with a controller in the rack equipment 140-141, where the controller in the rack equipment 140-141 communicates with the analyzer 116. In at least one implementation, a power source 114 may provide power to the sensor bars through the analyzer 116, wherein the power is provided over the communication lines 120, 121, and 122. Alternatively, the power may be provided through another power source other than the power source 114.

In certain implementations, the analyzer 116 communicates with an infrastructure management system 102. In at least one example, the analyzer 116 communicates with the infrastructure management system 102 through an IP network 110. In an example implementation of such an embodiment, the analyzer 116 may include an ETHERNET network interface (and associated RJ-45 port) so that the analyzer 116 can be coupled to the IP network 110 using a CAT-5 or CAT-6 twisted-pair copper cable. It is to be understood, however, that the analyzer 116 may communicate with the infrastructure management system through other communicative means.

It is noted that, for ease of explanation, the IP network 110 is shown using a separate cloud symbol, but it is to be understood that the analyzer 116, rack 160, rack equipment 140-141, and cabling 120-122 described herein can be used to implement a part of the IP network 110 over which the signals produced by the sensor bars 130-132 may be communicated. Alternatively, the IP network 110 over which the information produced by the sensor bars 130-132 is communicated may be kept separate from other networks through which the rack equipment 140-141 communicate.

The infrastructure management system 102 is typically implemented as software that runs on a computer that is coupled to the IP network 110. The infrastructure management system 102 may include information about devices located within the rack 160. Further, the infrastructure management system 102 may also be configured to receive information pertaining to various other devices and media used to implement the physical layer in the network. For example, the physical layer information (PLI) that is communicated to the infrastructure management system 102 may include information about other devices in the network as well as information about segments of physical communication media attached to the ports of those devices. The device information may include, for example, an identifier for each device, a type identifier that identifies the device's type, and information that includes information about device locations within the network. The media information includes information that is read from storage devices that are attached to various segments of physical communication media.

Examples of media information that can be stored in such storage devices include, without limitation, an identifier that uniquely identifies that particular segment of physical communication media (similar to an ETHERNET Media Access Control (MAC) address but associated with the physical communication media and/or connector attached to the physical communication media), a part number, a plug or other connector type, a cable or fiber type and length, a serial number, a cable polarity, a date of manufacture, a manufacturing lot number, information about one or more visual attributes of physical communication media or a connector attached to the physical communication media (such as information about the color or shape of the physical communication media or connector or an image of the physical communication media or connector), and other information used by an Enterprise Resource Planning (ERP) system or inventory control system. In other embodiments, alternate or additional data is stored in such storage devices. For example, testing, media quality, or performance information can be stored in such storage devices. The testing, media quality, or performance information, for example, can be the results of testing that is performed when a particular segment of media is manufactured or installed.

The information provided to the infrastructure management system 102 can also include information that is manually entered (for example, using a Web interface that is implemented by the infrastructure management system 102 or a mobile application).

The infrastructure management system 102 may include or use a database or other data store (not shown) for storing the information provided to it. The infrastructure management system 102 may also include functionality that provides an interface for external devices or entities to access the physical layer information maintained by the infrastructure management system 102. This access can include retrieving information from the management entity 102 as well as supplying information to the infrastructure management system 102. In this example, the infrastructure management system 102 is implemented as "middleware" that is able to provide such external devices and entities with transparent and convenient access to the information maintained by the infrastructure management system 102. As such, the infrastructure management system 102 is able to monitor the system 100 for the presence of equipment. As the infrastructure management system 102 includes the sensor bars 130-132, the infrastructure management system 102 may also monitor for the presence of equipment 140-141 mounted within a rack 160.

Figure 2A:
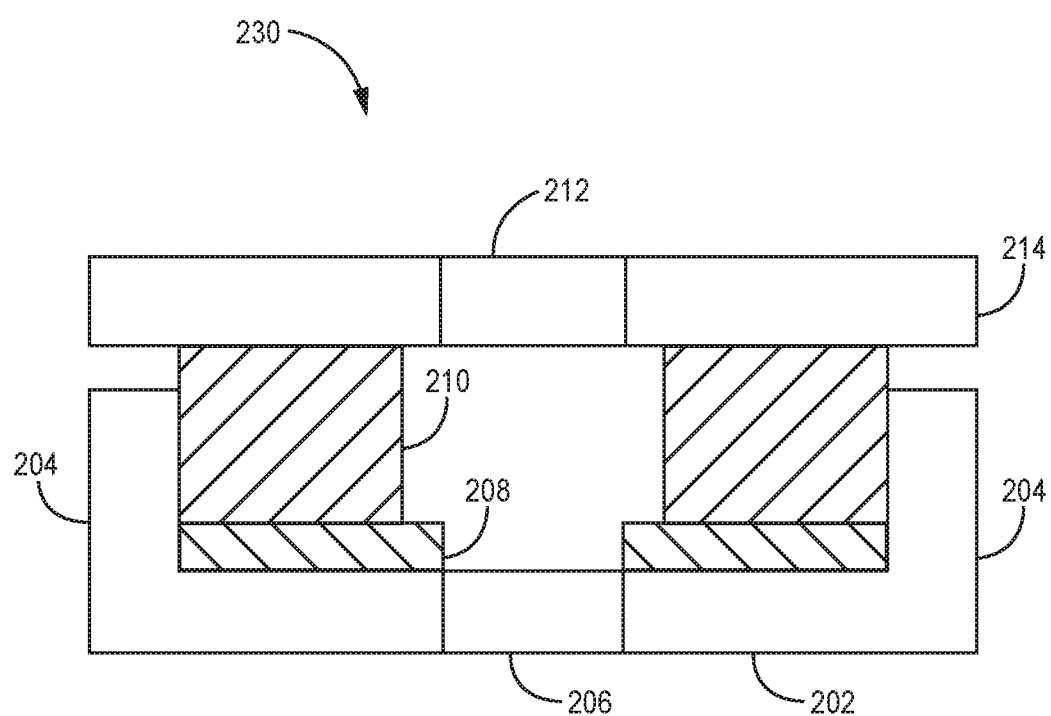
FIGS. 2A and 2B are diagrams illustrating exemplary embodiments of sensor bars.

FIG. 2A is a cross section of a sensor bar 230 according to one exemplary embodiment described herein. In at least one exemplary implementation, the sensor bar 230 may function to determine whether equipment is mounted within a rack such as described above with relation to the sensor bars 130-132. In certain embodiments, the sensor bar 230 may comprise a back plate 202. The back plate 202 may be made from a single piece of solid metal or other material that provides the desired structural support for any equipment being mounted to a rack. The back plate 202 provides a mounting surface that abuts against a mounting portion of a rack. In certain implementations, to secure the sensor bar 230 against a rack, the back plate 202 may include multiple back holes 206 that extend through the back plate 202. In one exemplary implementation, the back holes 206 may extend through the back plate at locations that correspond with mounting holes on the rack. Further, the back plate 202 of the sensor bar 230 may include two flanges 204 such that the back plate has a "U" shape.

In exemplary embodiments described herein, the sensor bar 230 includes a top plate 214 that abuts against the rack equipment that is mounted within the rack. Similar to the back plate 202, the top plate 214 may also be fabricated from a single piece or multiple pieces of solid metal or other material that provides the desired structural support for any equipment being mounted to the rack. The top plate 214 further includes multiple top holes 212 that extend through the top plate 214. The multiple top holes 212 extend through the top plate 214 at locations that correspond with the back holes 206.

In certain implementations, the sensor bar 230 includes a flexible layer 210 and a switching mechanism 208 between the top plate 214 and the back plate 202, wherein the flexible layer 210 and the switching mechanism 208 lie between the flanges 204 of the back plate 202. For example, the switching mechanism 208 may lie against a surface of the back plate 202 that is adjacent to and between the flanges 204. The flexible layer 210 then contacts the side of the switching mechanism 208 that is opposite to the side of the switching mechanism 208 that contacts the back plate 202. Further, the flexible layer 210 extends away from the back plate 202 farther than the flanges 204 and contacts a surface of the top plate 214 that faces the back plate 202.

In at least one exemplary implementation, when the rack mounted equipment is placed in the rack, bolts may be placed through the top holes 212 and the back holes 206. As the bolts are torqued or other movement that moves the top plate 214 towards the back plate 202 pressure may be applied to the flexible layer 210 and the switching mechanism 208, which applied pressure causes the switching mechanism 208 to switch and transmit a signal that indicates that rack mounted equipment is in place within the associated location in the rack. Further, as the bolts are progressively torqued the top plate 214 moves towards the back plate 202 until the top plate 214 abuts against the flanges 204 and the bolts become unable to move the top plate 214 closer towards the back plate 202. As such, the flanges 204 prevent the top plate 214 and back plate 202 from damaging the flexible layer 210 and switching mechanism 208 through excessive tightening of bolts extending through the sensor bar 230. As stated above, the combination of the back plate 202 and the flanges 204 may substantially form a U shape, however, the combination of the flanges 204 and the back plate 202 may form any shape capable of holding the combination of the flexible layer 210 and switching mechanism 208 between the top plate 214 and the back plate 202 such that the flanges 204 stop the movement of the top plate 214 towards the back plate 202 when equipment is mounted within the rack.

In at least one embodiment, the switching mechanism 208 provides an absent/present signal to a scanning module. The scanning module may be a controller present on the rack that communicates with the analyzer, such as analyzer 116. Alternatively, the switching mechanism 208 may communicate directly with the analyzer 116. In at least one implementation, the switching mechanism 208 may be comprised of switching pairs, where one set of switches may be connected to one another through a common conductor and the other switches may have their own conductor. Alternatively, a pair or group of pairs of switches may have their own multi-drop bus controller. When a multi-drop bus controller is used, the component count may be increased but the number of conductors running along the sensor bar 230 may be decreased and may simplify the construction of the bar accordingly.

In at least one exemplary implementation, the flexible layer 210 may be fabricated from silicone rubber, or material with a similar modulus. As described above, the shape of the flexible layer 210 may be such that the flexible layer 210 fits within the U-shaped trough formed by the flanges 204 and the back plate 202 and extends beyond the flanges 204, when equipment is not mounted. Further as stated, the flexible layer 210 provides cushioning to prevent the switch mechanism 208 from being crushed by the continuous pressure of the mounted equipment. Also, in certain implementations, the flexible layer 210 may have holes in the locations corresponding to the locations of the holes 206 in the back plate 202 and the holes 212 in the top plate 214. In certain implementations, the holes through the flexible layer 210 may be larger in diameter than the holes 206 through the back plate 202 and the holes 212 through the top plate 214. The larger diameter may allow for deformation of the flexible layer 210 during the compression of the flexible layer 210 that occurs as equipment is mounted in the rack and the top plate 214 moves towards the back plate 202.

Figure 2B:
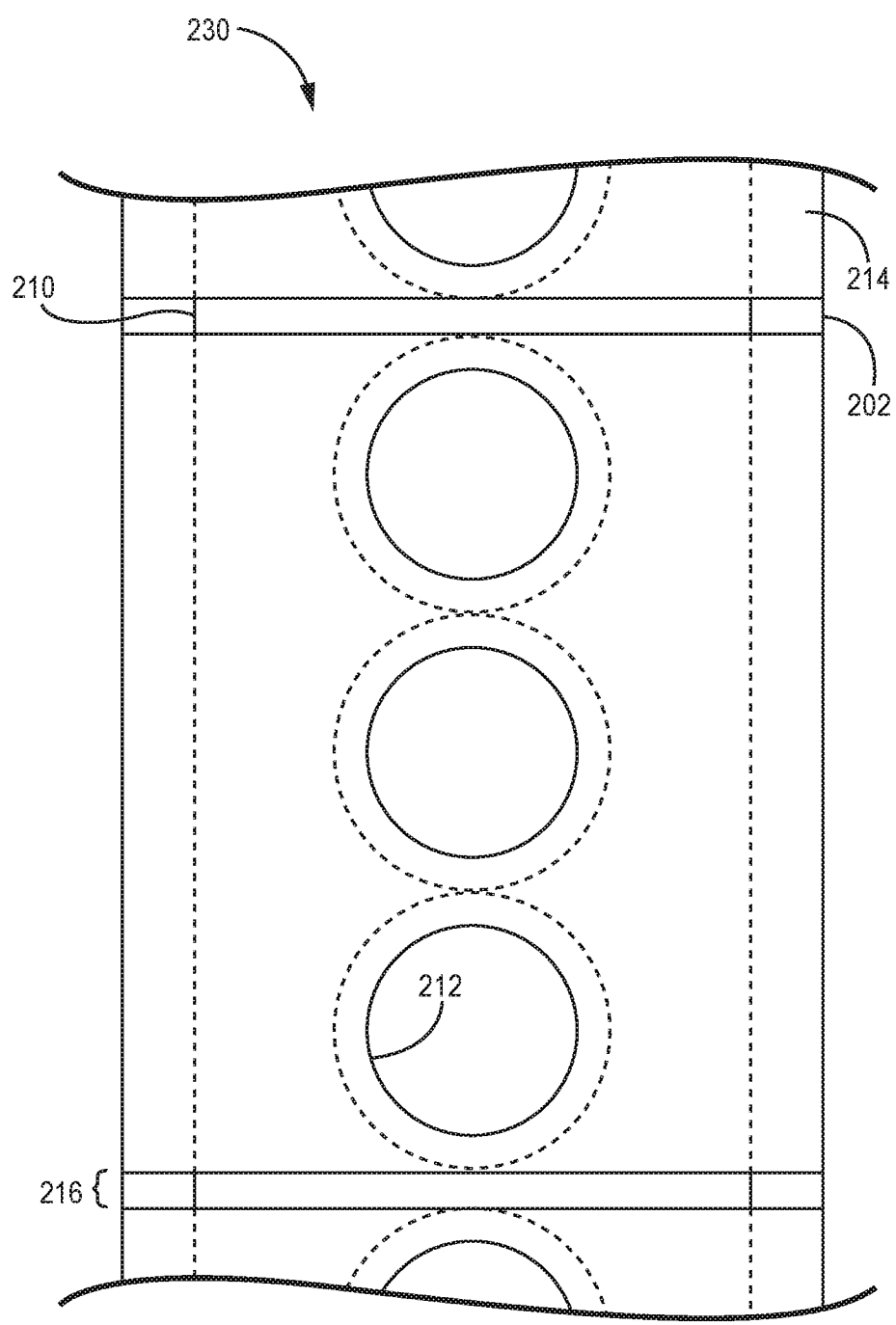

FIG. 2B is an illustration of a view of a segment of a sensor bar 230 from the inside of a rack. As illustrated, the top plate 214 lies on the side of the flexible layer 210 that faces the inside of the rack, which flexible layer 210 lies between the flanges 204 of the back plate 202. In an alternative implementation, the top plate 214 may lie on the side of the flexible layer 210 that faces the side of the rack. Further, top holes 212 extend through the top plate 214. Similarly, back holes 206 extend through the back plate 202 at locations that correspond to the holes 212 that extend through the top plate 214. As illustrated, the top plate 214 may be segmented into different portions. For example, the top plate 214 may include different segments that include sets of the top holes 212. For example, a segment may include three top holes 212. In an alternative implementation, the top plate 214 may comprise a single segment. Each segment may have a different switch associated with the segment, such that as the switch is turned on and provides a signal to the analyser, the analyser may determine when each segment is tightened and equipment is correctly mounted within the rack. Conversely, the analyser may determine when equipment is removed from the rack.

Figure 3:
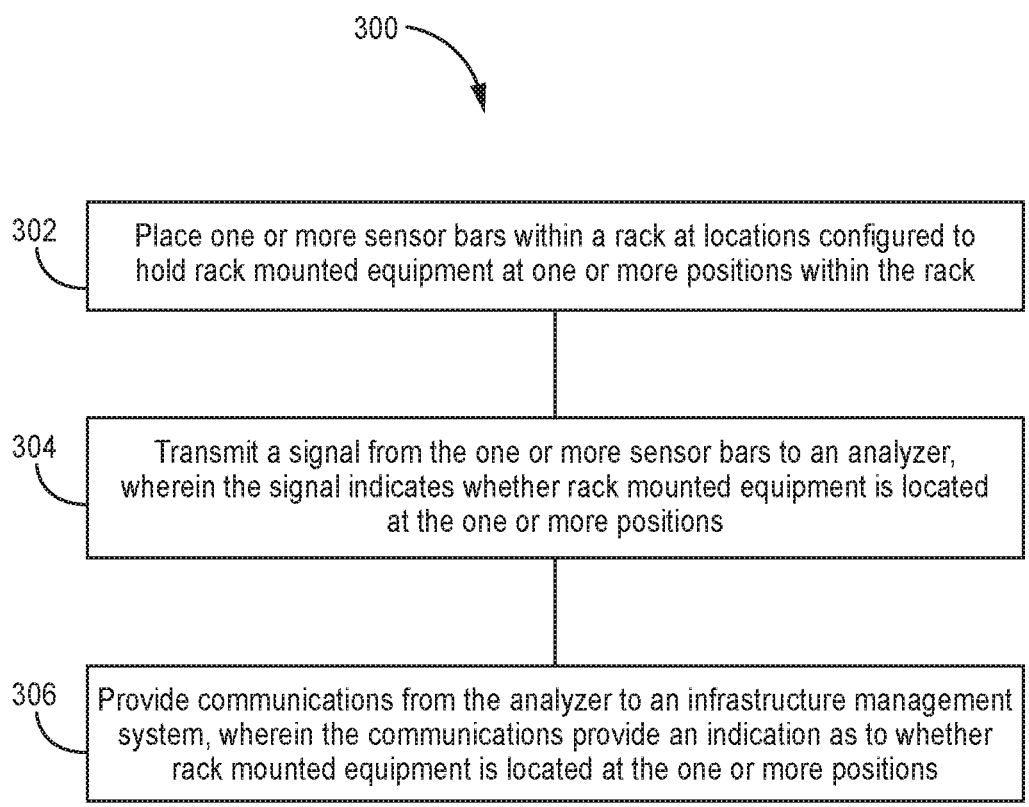
FIG. 3 is a flow diagram of an exemplary embodiment for directly monitoring for the presence of rack mounted equipment.

FIG. 3 is a flow diagram of a method 300 for directly monitoring for the presence of rack mounted equipment. Method 300 proceeds at 302 where one or more sensor bars are placed within a rack at locations configured to hold rack mounted equipment at one or more positions within the rack. For example, the sensor bars may be placed between rack-mounted equipment and a mounting location within a rack. The method 300 then proceeds at 304, where a signal is transmitted from the one or more sensor bars to an analyzer, wherein the signal indicates whether rack mounted equipment is located at the one or more positions. For instance, when equipment is mounted within the rack, a switch in the sensor bar may generate a signal that is transmitted to an analyzer. Further, the method 300 may proceed at 306, where communications are provided from the analyzer to an infrastructure management system, wherein the communications provide an indication as to whether rack mounted equipment is located at the one or more positions. In at least one exemplary implementation, the infrastructure management system is able to determine, based on the communications, whether rack-mounted equipment is presently mounted within the rack.

Example Embodiments

Example 1 includes a system for monitoring for the presence of rack mounted equipment, the system comprising: one or more racks, each rack in the one or more racks configured to hold rack mounted equipment at one or more positions within the rack; one or more sensor bars associated with each position in the one or more positions, wherein each sensor bar in the one or more sensor bars produces a signal that indicates whether the rack mounted equipment is located at the position associated with a respective sensor bar; an analyzer configured to receive the signal produced by the sensor bar, wherein the analyzer provides an indication that rack mounted equipment is located at the position to an infrastructure management system. Example 2 includes the system of Example 1, wherein the sensor bar comprises: a back plate having back plate holes that are periodically located along the length of the back plate, wherein the back plate holes extend through the back plate; a switching mechanism; a top plate having top plate holes that are periodically located along the length of the top plate, wherein the top plate holes are at locations associated with corresponding back plate holes, wherein the switching mechanism is between the back plate and the top plate such that the switching mechanism switches as the top plate moves toward the back plate.

Example 3 includes the system of Example 2, further comprising a flexible layer between the back plate and the top plate, wherein the flexible layer cushions the movement of the top plate towards the back plate, wherein the flexible layer comprises flexible layer holes extending through the flexible layer, the flexible layer holes at locations associated with corresponding top plate holes and back plate holes.

Example 4 includes the system of Example 3, wherein the flexible layer holes have a larger diameter than the top plate holes and the back plate holes.

Example 5 includes the system of any of Examples 2-4, further comprising one or more flanges on the back plate that limit the movement of the top plate towards the back plate.

Example 6 includes the system of any of Examples 2-5, wherein the top plate is segmented.

Example 7 includes the system of any of Examples 2-6, wherein the switching mechanism is comprised of a plurality of switches that extend along the length of the sensor bar.

Example 8 includes the system of Example 7, wherein the plurality of switches comprise a plurality of switching pairs, wherein each switching pair has a first switch coupled to a common conductor and a second switch coupled to a dedicated conductor, wherein the common conductor is shared by the first switch in each of the plurality of switching pairs and the second switch in each of the plurality of switching pairs has its own dedicated conductor.

Example 9 includes the system of any of Examples 7-8, wherein one or more pairs of switches in the plurality of switches has an associated multi-drop bus.

Example 10 includes the system of any of Examples 1-9, wherein a sensor bar is located on each side of the rack.

Example 11 includes a method for monitoring for the presence of rack mounted equipment, the method comprising: placing one or more sensor bars within a rack at locations configured to hold rack mounted equipment at one or more positions within the rack; transmitting a signal from the one or more sensor bars to an analyzer, wherein the signal indicates whether rack mounted equipment is located at the one or more positions associated with a respective sensor bar; providing communications from the analyzer to an infrastructure management system, wherein the communications provide an indication as to whether rack mounted equipment is located at the one or more positions.

Example 12 includes the method of Example 11, wherein the sensor bar comprises: a back plate having back plate holes that are periodically located along the length of the back plate, wherein the back plate holes extend through the back plate; a switching mechanism; a top plate having top plate holes that are periodically located along the length of the top plate, wherein the top plate holes are at locations associated with corresponding back plate holes, wherein the switching mechanism is between the back plate and the top plate such that the switching mechanism switches as the top plate moves toward the back plate.

Example 13 includes the method of Example 12, further comprising a flexible layer between the back plate and the top plate, wherein the flexible layer cushions the movement of the top plate towards the back plate, wherein the flexible layer comprises flexible layer holes extending through the flexible layer, the flexible layer holes at locations associated with corresponding top plate holes and back plate holes.

Example 14 includes the method of Example 13, wherein the flexible layer holes have a larger diameter than the top plate holes and the back plate holes.

Example 15 includes the method of any of Examples 12-14, further comprising one or more flanges on the back plate that limit the movement of the top plate towards the back plate.

Example 16 includes the method of any of Examples 12-15, wherein the top plate is segmented into one or more segments.

Example 17 includes the method of Example 16, wherein transmitting the signal from the one or more sensor bars to the analyzer comprises transmitting a signal associated with a segment in the one or more segments.

Example 18 includes the method of any of Examples 12-17, wherein the switching mechanism is comprised of a plurality of switches that extend along the length of the sensor bar.

Example 19 includes the method of any of Examples 17-18, wherein the plurality of switches comprise a plurality of switching pairs, wherein each switching pair has a first switch coupled to a common conductor and a second switch coupled to a dedicated conductor, wherein the common conductor is shared by the first switch in each of the plurality of switching pairs and the second switch in each of the plurality of switching pairs has its own dedicated conductor.

Example 20 includes the method of any of Examples 17-19, wherein one or more pairs of switches in the plurality of switches has an associated multi-drop bus.

Example 21 includes a system, the system comprising: one or more racks; one or more pieces of equipment mounted at one or more positions within the one or more racks; one or more sensor bars associated with the one or more positions, wherein each sensor bar in the one or more sensor bars produces a signal that indicates whether the one or more pieces of equipment are mounted within the one or more racks; and an infrastructure management system configured to receive an indication based on the signal as to whether the one or more pieces of equipment are mounted within the one or more racks.

Example 22 includes the system of Example 21, further comprising an analyzer configured to receive the signal and provide the indication to the infrastructure management system.

Example 23 includes the system of any of Examples 21-22, wherein the sensor bar comprises: a back plate having back plate holes that are periodically located along the length of the back plate, wherein the back plate holes extend through the back plate; a switching mechanism; a top plate having top plate holes that are periodically located along the length of the top plate, wherein the top plate holes are at locations associated with corresponding back plate holes, wherein the switching mechanism is between the back plate and the top plate such that the switching mechanism switches as the top plate moves toward the back plate.

Example 24 includes the system of Example 23, further comprising a flexible layer between the back plate and the top plate, wherein the flexible layer cushions the movement of the top plate towards the back plate, wherein the flexible layer comprises flexible layer holes extending through the flexible layer, the flexible layer holes at locations associated with corresponding top plate holes and back plate holes.

Example 25 includes the system of Example 24, wherein the flexible layer holes have a larger diameter than the top plate holes and the back plate holes.

Example 26 includes the system of any of Examples 23-25, further comprising one or more flanges on the back plate that limit the movement of the top plate towards the back plate.

Example 27 includes the system of any of Examples 23-26, wherein the top plate is segmented.

Example 28 includes the system of any of Examples 23-27, wherein the switching mechanism is comprised of a plurality of switches that extend along the length of the sensor bar.

Example 29 includes the system of Example 28, wherein the plurality of switches comprises at least one of: a plurality of switching pairs, wherein each switching pair has a first switch coupled to a common conductor and a second switch coupled to a dedicated conductor, wherein the common conductor is shared by the first switch in each of the plurality of switching pairs and the second switch in each of the plurality of switching pairs has its own dedicated conductor; and a multi-drop bus.

A number of embodiments have been described. Nevertheless, it will be understood that various modifications to the described embodiments may be made without departing from the spirit and scope of the claimed invention. Also, combinations of the individual features of the above-described embodiments are considered within the scope of the inventions disclosed here.

What is claimed is:

1. A system for monitoring for the presence of rack mounted equipment, the system comprising:
    one or more racks, each rack in the one or more racks configured to hold rack mounted equipment at one or more positions within the rack;
    one or more sensor bars associated with each position in the one or more positions, wherein each sensor bar in the one or more sensor bars produces a signal that indicates whether the rack mounted equipment is located at the position associated with a respective sensor bar, wherein the sensor bar includes,
        a back plate having back plate holes that are periodically located along the length of the back plate, wherein the back plate holes extend through the back plate,
        a switching mechanism, and
        a top plate having top plate holes that are periodically located along the length of the top plate, wherein the top plate holes are at locations associated with corresponding back plate holes, wherein the switching mechanism is between the back plate and the top plate such that the switching mechanism switches as the top plate moves toward the back plate; and
    an analyzer configured to receive the signal produced by the sensor bar, wherein the analyzer provides an indication that rack mounted equipment is located at the position to an infrastructure management system.

2. The system of claim 1, further comprising a flexible layer between the back plate and the top plate, wherein the flexible layer cushions the movement of the top plate towards the back plate, wherein the flexible layer comprises flexible layer holes extending through the flexible layer, the flexible layer holes at locations associated with corresponding top plate holes and back plate holes.

3. The system of claim 2, wherein the flexible layer holes have a larger diameter than the top plate holes and the back plate holes.

4. The system of claim 1, further comprising one or more flanges on the back plate that limit the movement of the top plate towards the back plate.

5. The system of claim 1, wherein the top plate is segmented.

6. The system of claim 1, wherein the switching mechanism is comprised of a plurality of switches that extend along the length of the sensor bar.

7. The system of claim 6, wherein the plurality of switches comprise a plurality of switching pairs, wherein each switching pair has a first switch coupled to a common conductor and a second switch coupled to a dedicated conductor, wherein the common conductor is shared by the first switch in each of the plurality of switching pairs and the second switch in each of the plurality of switching pairs has its own dedicated conductor.

8. The system of claim 6, wherein one or more pairs of switches in the plurality of switches has an associated multi-drop bus.

9. The system of claim 1, wherein a sensor bar is located on each side of the rack.

10. A method for monitoring for the presence of rack mounted equipment, the method comprising:
    placing one or more sensor bars within a rack at locations configured to hold rack mounted equipment at one or more positions within the rack, wherein at least one sensor bar includes,
        a back plate having back plate holes that are periodically located along the length of the back plate, wherein the back plate holes extend through the back plate,
        a switching mechanism, and
        a top plate having top plate holes that are periodically located along the length of the top plate, wherein the top plate holes are at locations associated with corresponding back plate holes, wherein the switching mechanism is between the back plate and the top plate such that the switching mechanism switches as the top plate moves toward the back plate;
    transmitting a signal from the one or more sensor bars to an analyzer, wherein the signal indicates whether rack mounted equipment is located at the one or more positions associated with a respective sensor bar; and
    providing communications from the analyzer to an infrastructure management system, wherein the communications provide an indication as to whether rack mounted equipment is located at the one or more positions.

11. The method of claim 10, further comprising a flexible layer between the back plate and the top plate, wherein the flexible layer cushions the movement of the top plate towards the back plate, wherein the flexible layer comprises flexible layer holes extending through the flexible layer, the flexible layer holes at locations associated with corresponding top plate holes and back plate holes.

12. The method of claim 11, wherein the flexible layer holes have a larger diameter than the top plate holes and the back plate holes.

13. The method of claim 10, further comprising one or more flanges on the back plate that limit the movement of the top plate towards the back plate.

14. The method of claim 10, wherein the top plate is segmented into one or more segments.

15. The method of claim 14, wherein transmitting the signal from the one or more sensor bars to the analyzer comprises transmitting a signal associated with a segment in the one or more segments.

16. The method of claim 10, wherein the switching mechanism is comprised of a plurality of switches that extend along the length of the sensor bar.

17. The method of claim 15, wherein the plurality of switches comprise a plurality of switching pairs, wherein each switching pair has a first switch coupled to a common conductor and a second switch coupled to a dedicated conductor, wherein the common conductor is shared by the first switch in each of the plurality of switching pairs and the second switch in each of the plurality of switching pairs has its own dedicated conductor.

18. The method of claim 15, wherein one or more pairs of switches in the plurality of switches has an associated multi-drop bus.

19. A system, the system comprising:
one or more racks;
one or more pieces of equipment mounted at one or more positions within the one or more racks;
one or more sensor bars associated with the one or more positions, wherein each sensor bar in the one or more sensor bars produces a signal that indicates whether the one or more pieces of equipment are mounted within the one or more racks, wherein at least one sensor bar includes,
a back plate having back plate holes that are periodically located along the length of the back plate, wherein the back plate holes extend through the back plate,
a switching mechanism, and
a top plate having top plate holes that are periodically located along the length of the top plate, wherein the top plate holes are at locations associated with corresponding back plate holes, wherein the switching mechanism is between the back plate and the top plate such that the switching mechanism switches as the top plate moves toward the back plate; and
an infrastructure management system configured to receive an indication based on the signal as to whether the one or more pieces of equipment are mounted within the one or more racks.

20. The system of claim 19, further comprising an analyzer configured to receive the signal and provide the indication to the infrastructure management system.

21. The system of claim 19, further comprising a flexible layer between the back plate and the top plate, wherein the flexible layer cushions the movement of the top plate towards the back plate, wherein the flexible layer comprises flexible layer holes extending through the flexible layer, the flexible layer holes at locations associated with corresponding top plate holes and back plate holes.

22. The system of claim 21, wherein the flexible layer holes have a larger diameter than the top plate holes and the back plate holes.

23. The system of claim 19, further comprising one or more flanges on the back plate that limit the movement of the top plate towards the back plate.

24. The system of claim 19, wherein the top plate is segmented.

25. The system of claim 19, wherein the switching mechanism is comprised of a plurality of switches that extend along the length of the sensor bar.

26. The system of claim 25, wherein the plurality of switches comprises at least one of:
a plurality of switching pairs, wherein each switching pair has a first switch coupled to a common conductor and a second switch coupled to a dedicated conductor, wherein the common conductor is shared by the first switch in each of the plurality of switching pairs and the second switch in each of the plurality of switching pairs has its own dedicated conductor; and
a multi-drop bus.

* * * * *